US006788403B2

(12) United States Patent
Lien

(10) Patent No.: US 6,788,403 B2
(45) Date of Patent: Sep. 7, 2004

(54) CHECKING MACHINE FOR CHECKING TAPE AUTOMATED BONDING REGION OF DISPLAY MODULE

(75) Inventor: Chun-Hung Lien, Taoyuan Shien (TW)

(73) Assignee: Hannstar Display Corp., Taipei (TW)

( * ) Notice: Subject to any disclaimer, the term of this patent is extended or adjusted under 35 U.S.C. 154(b) by 227 days.

(21) Appl. No.: 09/982,631

(22) Filed: Oct. 18, 2001

(65) Prior Publication Data

US 2002/0140430 A1 Oct. 3, 2002

(30) Foreign Application Priority Data

Apr. 3, 2001 (TW) .................................... 90205179 U

(51) Int. Cl.[7] ....................... G01N 21/00; G01N 21/01; G02B 27/32; G02F 1/1333; G01R 31/00

(52) U.S. Cl. ............................... 356/237.1; 356/239.3; 349/58; 324/500; 324/537; 324/758; 324/765; 324/770; 324/763

(58) Field of Search .......................... 356/237.1, 239.1, 356/239.3, 244, 256; 349/58; 324/500, 537, 754, 758, 765, 770, 763

(56) References Cited

U.S. PATENT DOCUMENTS

| | | | | | |
|---|---|---|---|---|---|
| 3,680,805 | A | * | 8/1972 | Stewart et al. | 242/538.2 |
| 4,854,039 | A | * | 8/1989 | Wendt | 29/832 |
| 5,497,103 | A | * | 3/1996 | Ebert et al. | 324/754 |
| 5,876,262 | A | * | 3/1999 | Kelly et al. | 446/118 |
| 6,590,624 | B1 | * | 7/2003 | Lee | 349/54 |

* cited by examiner

*Primary Examiner*—Russell Adams
*Assistant Examiner*—Magda Cruz
(74) *Attorney, Agent, or Firm*—Kirton & McConkie; Michael F. Krieger

(57) ABSTRACT

A checking machine for being used in a fabricating process of a display module and checking a position of a tape automated bonding (TAB) region is provided. The checking machine includes a main holder having an inclined panel positioned at an inclination β relative to the horizontal, wherein the range of the inclination β is 0°<β≦90°, a test plate having a first hollow portion for suiting a size of the display module and a circuit plate disposed around the first hollow portion for suiting the position of the tape automated bonding region, and a fixing device for fixing the test plate to the inclined panel, thereby the tape automated bonding region is electrically connected with the circuit plate.

13 Claims, 3 Drawing Sheets

CHECKING MACHINE FOR CHECKING TAPE AUTOMATED BONDING REGION OF DISPLAY MODULE

The present invention claims priority to application Ser. No. 90205179 filed Apr. 3, 2001, in Taiwan.

FIELD OF THE INVENTION

The present invention relates to a checking machine, and more particularly to a checking machine for being used in a fabricating process of a display module and checking a position of a tape automated bonding (TAB) region.

BACKGROUND OF THE INVENTION

In the fabricating process of a liquid crystal display module, assembling a printed circuit board is performed after a tape automated bonding (TAB) region provided on a panel of the liquid crystal display. Before assembling the printed circuit board, a checking step performed by a checking machine is necessary for confirming whether the TAB region is in the standard position.

Please refer to FIG. 1. FIG. 1 is a schematic view showing a display module having a screen region 10 and a TAB region 20.

Please refer to FIG. 2. FIG. 2 is a schematic view showing a conventional checking machine for on line bonding (OLB). The checking machine includes a main body 1 and a test plate 2. The main body 1 includes a main holder 11 and a transparent or hollow cover 12. A back light source 13 is installed in the main holder 11. The test plate 2 includes a supporting plate 21 and a splint 22. The supporting plate 21 has a circuit plate 23 for the test. The supporting plate 21 and the splint 22 both have hollow portions. The hollow portions are used for a beam from the back light source 13 passing through when the display is clipped between the supporting plate 21 and the splint 22. In addition, the checking machine further includes a fixing device 14. The fixing device 14 includes a pressing shaft 141 linking a hoisting mechanism 142.

The checking step for checking the position of the TAB region is illustrated as follows. The assembly of the display module clipped between the supporting plate 21 and the splint 22 is placed on the main holder 11, the cover 12 is covered on the assembly, and the back light source 13 is turned on. The pressing shaft 141 is pressed downward, and the hoisting mechanism 142 is raised. Thus, the test plate 2 is tightly clipped between the main holder 11 and the cover 12, thereby the TAB region 20 on the display module is electrically connected to the circuit plate 23.

The circuit plate 23 positioned on the supporting plate 21 could represent the circuit plate, which would be assembled on the display module in the following fabricating process. Hence, the state of electric conduction between the TAB region 20 and the circuit plate 23 is checked to represent the state of the TAB region. The state of electric conduction between the TAB region 20 and the circuit plate 23 is shown on the screen of the display module. Only the display module having the standard TAB region could be assembled with a printed circuit board.

In the conventional checking machine, the panel 111 of the main holder 11 is a horizontal panel. The user should bend his back to look at the screen of the display module, or a view angle a shown in FIG. 3 would occur. Moreover, the angle $\alpha$ between the line of the user' vision and the normal 16 of the screen is larger, and the brightness of the screen is slighter. The conventional checking machine has some drawbacks such as the conventional checking machine is operated laboriously and the checking effect is decrease owing to the existence of the view angle.

The present invention provides a checking machine for being used in a fabricating process of a display module and checking a position of a tape automated bonding (TAB) region to overcome the drawbacks of the conventional checking machine.

SUMMARY OF THE INVENTION

It is therefore an object of the present invention to provide a checking machine having an inclined panel for a user to check a position of a tape automated bonding (TAB) region without the problem of the view angle.

It is another object of the present invention to provide a checking machine for checking a position of a tape automated bonding (TAB) region and saving strength by using a pressure-drawing module as a fixing device.

It is an aspect of the present invention to provide a checking machine for being used in a fabricating process of a display module and checking a position of a tape automated bonding (TAB) region.

In accordance with the present invention, the checking machine includes a main holder having an inclined panel positioned at an inclination $\beta$ relative to the horizontal, wherein the range of the inclination $\beta$ is $0° < \beta \leqq 90°$, a test plate having a first hollow portion for suiting a size of the display module and a circuit plate disposed around the first hollow portion for suiting the position of the tape automated bonding region, and a fixing device for fixing the test plate to the inclined panel, thereby the tape automated bonding region is electrically connected with the circuit plate.

Preferably, the range of the inclination $\beta$ is $20° \leqq \beta \leqq 60°$.

In addition, the test plate further includes a supporting plate having the circuit plate thereon and a second hollow portion for receiving the display module, and a splint having a third hollow portion for covering on the supporting plate, thereby the display module is clipped between the supporting plate and the splint.

The checking machine further includes a back light source disposed in the main holder for providing a beam for checking the display module.

The fixing device includes a first button for generating an activation command, an X-axial pressure-drawing module for moving toward X-axial direction to fix a first end of the test plate in response to the activation command, and a Y-axial pressure-drawing module for moving toward Y-axial direction to fix a second end of the test plate in response to the activation command.

Preferably, the X-axial pressure-drawing module is one of a pneumatic module and a hydraulic module.

Preferably, the Y-axial pressure-drawing module is one of a pneumatic module and a hydraulic module.

Preferably, one of the X-axial pressure-drawing module and the Y-axial pressure-drawing module is a motor-and-cam module.

Moreover, the fixing device further includes a second button for generating an angle-regulating command, and a Z-axial pressure-drawing module for moving toward a Z-axial direction to pivot the inclined panel, thereby regulating the inclination $\beta$ of the inclined panel relative to the horizontal.

Preferably, the Z-axial pressure-drawing module is one selected from a group of a pneumatic module, a hydraulic module and a motor-and-cam module.

In addition, an end of the inclined panel is connected to the main holder, and the inclination β is regulated by a pivot of the inclined panel.

It is another aspect of the present invention to provide a checking machine for being used in a fabricating process of a display module and checking a position of a tape automated bonding (TAB) region.

In accordance with the present invention, the checking machine includes a main holder having an inclined panel positioned at an inclination β relative to the horizontal, wherein the range of the inclination β is 0°<β23 90°, a test plate for supporting the display module, and a fixing device for fixing the test plate to the inclined panel, thereby the tape automated bonding region is checked, wherein the fixing device includes a first button for generating an activation command, and a pressure-drawing device for moving toward the test plate to fix the test plate to the inclined panel.

In addition, the pressure-drawing device includes an X-axial pressure-drawing module for moving toward X-axial direction to fix a first end of the test plate in response to the activation command, and a Y-axial pressure-drawing module for moving toward Y-axial direction to fix a second end of the test plate in response to the activation command.

Furthermore, the fixing device includes a second button for generating an angle-regulating command, and a Z-axial pressure-drawing module for moving toward a Z-axial direction to pivot the inclined panel, thereby regulating the inclination β of the inclined panel relative to the horizontal.

Preferably, the range of said inclination β is 20°≦β≦60°.

It is another aspect of the present invention to provide a checking machine for being used in a fabricating process of a display module having a screen and checking a position of a tape automated bonding (TAB) region.

In accordance with the present invention, the checking machine includes a main holder having an inclined panel positioned at an adjustable inclination β, a test plate having a hollow portion for suiting a size of the display module and a circuit plate disposed around the hollow portion for suiting the position of said tape automated bonding region, an angle-regulating device for regulating the inclination β until the screen is nearly perpendicular to a line of a user's vision, and a fixing device for fixing the test plate to the inclined panel, thereby the tape automated bonding region is electrically connected with the circuit plate.

The present invention may best be understood through the following descriptions with reference to the accompanying drawings, in which:

DETAILED DESCRIPTION OF THE PREFERRED EMBODIMENTS

Figure 4:
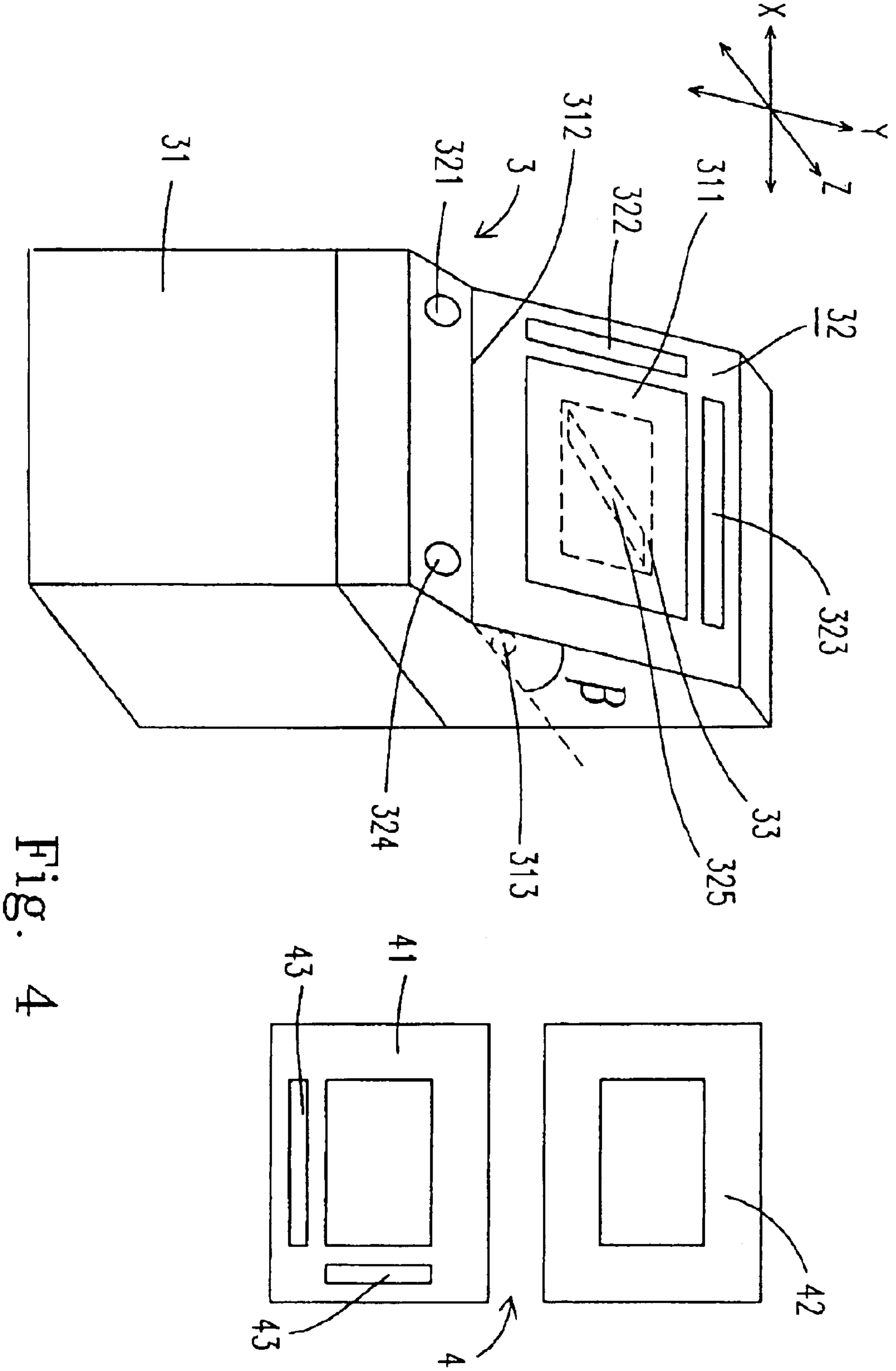
FIG. 4 is a schematic view showing the checking machine according to the preferred embodiment of the present invention.

Please refer to FIG. 4. FIG. 4 is a schematic view showing the checking machine for on line bonding according to the present invention. The checking machine includes a main body 3 and a test plate 4. The main body 3 includes a main holder 31 and a fixing device 32. The main holder 31 has an inclined panel 311 positioned at an inclination β, and the main holder 31 has a back light source 33 therein. The fixing device 32 includes a button 321, an X-axial pneumatic module 322 and a Y-axial pneumatic module 323. When the button is pressed by a user, the fixing device 32 is activated to fix the test plate 4 to the inclined panel 311. The test plate 4 includes a supporting plate 41 and a splint 42. The supporting plate 41 has a circuit plate 43 disposed thereon. The supporting plate 41 and the splint 42 both have hollow portions. The hollow portions are used for a beam from the back light source 33 passing through when a display module is clipped between the supporting plate 41 and the splint 42.

The checking step for confirming the position of the TAB region is illustrated as follows.

Figure 1:
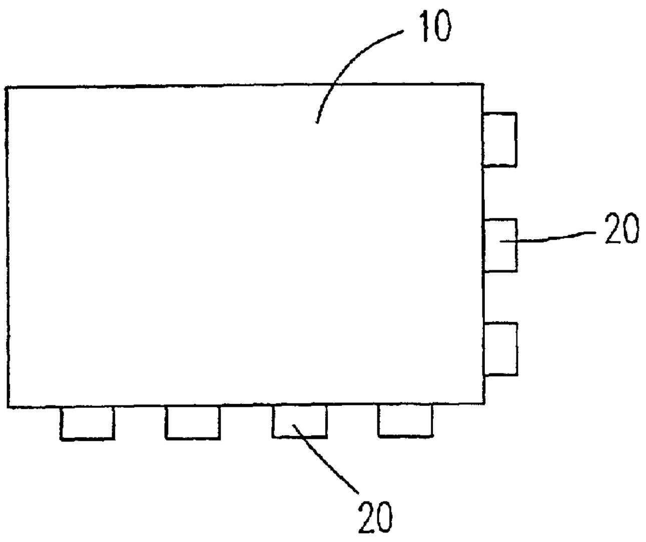
Fig. 1 PRIOR ART
FIG. 1 is a schematic view showing a display module.
Figure 2:
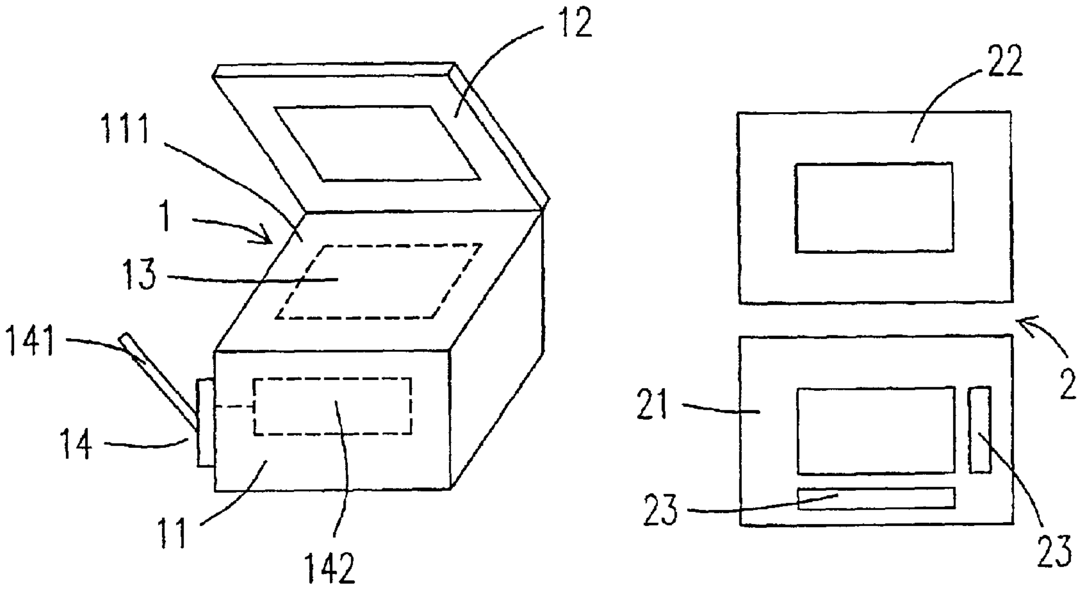
Fig. 2 PRIOR ART
FIG. 2 is a schematic view showing a conventional checking machine for on line bonding (OLB)
Figure 3:
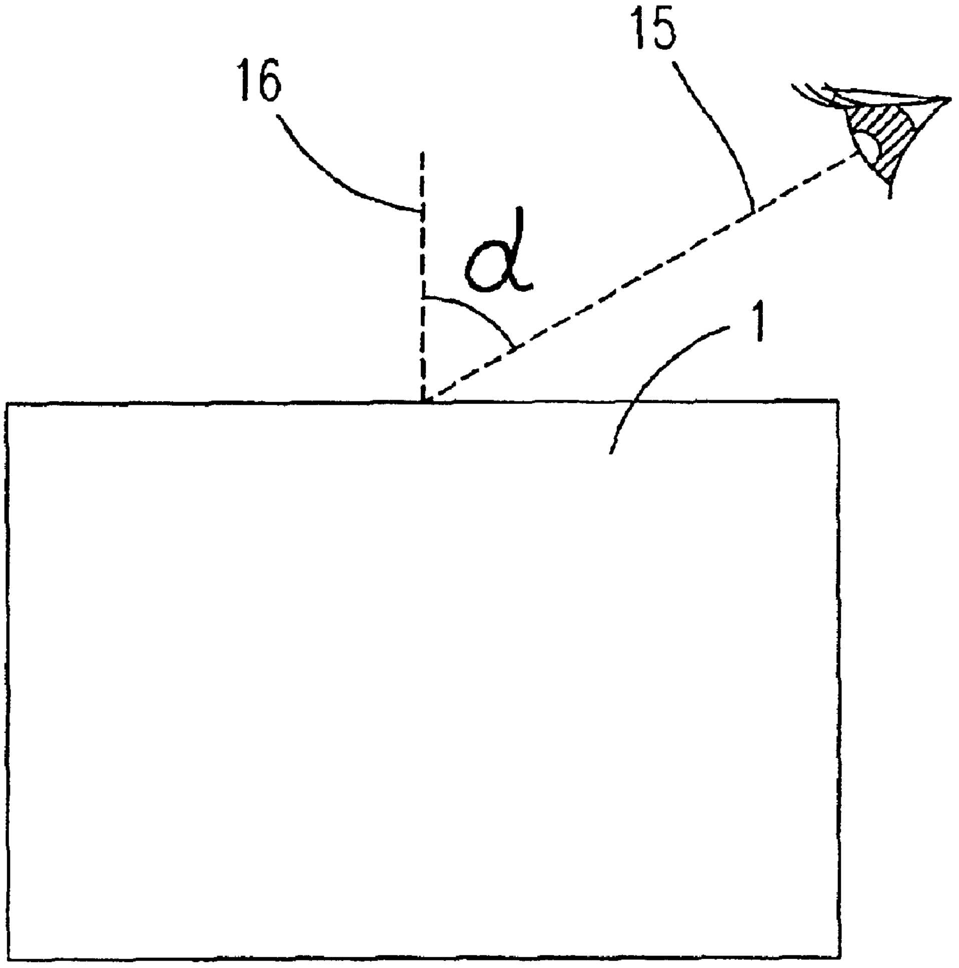
Fig. 3 PRIOR ART
FIG. 3 is a schematic view showing the problem of the view angle occurred in the conventional checking machine.

The display module as shown in FIG. 1 is clipped between the supporting plate 41 and the splint 42. The assembly of the display module, the supporting plate 41 and the splint 42 is placed on the inclined panel 311 of the main holder 31. When the button 321 is pressed, the X-axial pneumatic module and the Y-axial pneumatic module move respectively toward X-axial direction and Y-axial direction for fixing the test plate 4 to the inclined panel 311. Thus, the TAB region is electrically connected to the circuit plate 43 disposed on the supporting plate 41.

Then, the back light source 33 is turned on, the state of the TAB region is shown in the screen of the display module.

In addition, the inclination β (0°<β≦90°) of the inclined panel 311 could be adjusted according to the height of the checking machine and the height of the user, wherein the inclination β is preferably 40±20°. For example, the end 312 of the inclined panel 311 is connected to the main holder 31, and the fixing device 32 further includes a button 324, a Z-axial pneumatic module 325, thereby the included panel 311 is pivoted by the Z-axial pneumatic module 325 to regulate the inclination of the inclined panel 311. Thus, end 312 of inclined panel 311 is connected to main holder 31, and the inclination β is regulated by a pivot 313 of inclined panel 311.

The buttons 321, 324, the pneumatic modules 322, 323 and 325 in the foresaid embodiment could be the conventional elements and devices. IN addition, the pneumatic modules 322, 323 and 325 could be replaced with hydraulic modules or motor-and-cam modules.

The present invention provides an inclined and inclination-adjustable panel of a checking machine for solving the problem of view angle and being easily controlled in operation.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A checking machine for being used in a fabricating process of a display module and checking a position of a tape automated bonding (TAB) region, comprising:

a main holder having an inclined panel positioned at an inclination β relative to the horizontal, wherein the range of said inclination β is 0°<β≦90°;

a test plate having a first hollow portion for suiting a size of said display module and a circuit plate disposed around said first hollow portion for suiting said position of said tape automated bonding region; and a fixing device for fixing said test plate to said inclined panel, thereby said tape automated bonding region is electrically connected with said circuit plate, wherein said fixing device comprises:

a first button for generating an activation command;

an X-axial pressure-drawing module for moving toward an X-axial direction to fix a first end of said test plate in response to said activation command; and a Y-axial pressure-drawing module for moving toward a Y-axial direction to fix a second end of said test plate in response to said activation command.

2. The checking machine according to claim 1, wherein the range of said inclination β is 20°≦β≦60°.

3. The checking machine according to claim 1, wherein said test plate further comprises:

a supporting plate having said circuit plate thereon and a second hollow portion for receiving said display module; and a splint having a third hollow portion for covering said supporting plate, thereby said display module is clipped between said supporting plate and said splint, wherein said second hollow portion and said third hollow portion are overlapped to form said first hollow portion.

4. The checking machine according to claim 1, comprising a back light source disposed in said main holder for providing a beam for checking said display module.

5. The checking machine according to claim 1, wherein said X-axial pressure-drawing module is driven by one of a pneumatic module and a hydraulic module.

6. The checking machine according to claim 1, wherein said Y-axial pressure-drawing module is driven by one of a pneumatic module and a hydraulic module.

7. The checking machine according to claim 1, wherein one of said X-axial pressure-drawing module and said Y-axial pressure-drawing module is driven by a motor-and-cam module.

8. The checking machine according to claim 1, wherein said fixing device further comprises:

a second button for generating an angle-regulating command; and a Z-axial pressure-drawing module for moving toward a Z-axial direction to pivot said inclined panel, thereby regulating said inclination β of said inclined panel relative to said horizontal.

9. The checking machine according to claim 8, wherein said Z-axial pressure-drawing module is driven by one selected from a group of a pneumatic module, a hydraulic module and a motor-and-cam module.

10. The checking machine according to claim 1, wherein an end of said inclined panel is connected to said main holder, and said inclination β is regulated by a pivot of said inclined panel.

11. A checking machine for being used in a fabricating process of a display module and checking a position of a tape automated bonding (TAB) region, comprising:

a main holder having an inclined panel positioned at an inclination β relative to the horizontal, wherein the range of said inclination β is 0°<β≦90°;

a test plate for supporting said display module; and a fixing device for fixing said test plate to said inclined panel, thereby said tape automated bonding region is checked, wherein said fixing device comprises:

a first button for generating an activation command; and a pressure-drawing device for moving toward said test plate to fix said test plate to said inclined panel, wherein said pressure-drawing device comprises:

an X-axial pressure-drawing module for moving toward an X-axial direction to fix a first end of said test plate in response to said activation command; and a Y-axial pressure-drawing module for moving toward a Y-axial direction to fix a second end of said test plate in response to said activation command.

12. The checking machine according to claim 11, wherein said fixing device further comprises:

a second button for generating an angle-regulating command; and a Z-axial pressure-drawing module for moving toward a Z-axial direction to pivot said inclined panel, thereby regulating said inclination β of said inclined panel relative to said horizontal.

13. The checking machine according to claim 11, wherein the range of said inclination β is 20°≦60°.

* * * * *